(12) United States Patent
Schnell et al.

(10) Patent No.: US 7,094,475 B2
(45) Date of Patent: Aug. 22, 2006

(54) MCRALY-COATING

(75) Inventors: Alexander Schnell, Ennetbaden (CH);
Cyrille Bezencon, Reconvilier (CH);
Matthias Hoebel, Windisch (CH);
Abdus Suttar Khan, Ennetbaden (CH);
Maxim Konter, Klingnau (CH);
Wilfried Kurz, La Conversion (CH)

(73) Assignee: Alstom Technology LTD, Baden (CH)

( * ) Notice: Subject to any disclaimer, the term of this patent is extended or adjusted under 35 U.S.C. 154(b) by 144 days.

(21) Appl. No.: 10/490,018

(22) PCT Filed: Sep. 6, 2002

(86) PCT No.: PCT/IB02/03592

§ 371 (c)(1),
(2), (4) Date: Mar. 19, 2004

(87) PCT Pub. No.: WO03/027361

PCT Pub. Date: Apr. 3, 2003

(65) Prior Publication Data

US 2004/0234808 A1    Nov. 25, 2004

(30) Foreign Application Priority Data

Sep. 22, 2001   (EP)   ............................ 01122819

(51) Int. Cl.
*B32B 15/01*    (2006.01)
*F03B 3/12*    (2006.01)
(52) U.S. Cl. ............... 428/678; 428/679; 428/680; 428/610; 416/241 R
(58) Field of Classification Search .......... 428/678, 428/679, 680, 610; 416/241 R
See application file for complete search history.

(56) References Cited

U.S. PATENT DOCUMENTS

| 3,528,861 | A | 9/1970 | Elam et al. |
| 3,676,085 | A | 7/1972 | Evans et al. |
| 3,754,903 | A | 8/1973 | Goward et al. |
| 4,152,223 | A | 5/1979 | Wallace et al. |
| 4,313,760 | A | 2/1982 | Dardi et al. |
| 4,346,137 | A | 8/1982 | Hecht |
| 4,419,416 | A | 12/1983 | Gupta et al. |
| RE32,121 | E | 4/1986 | Gupta et al. |
| 4,585,481 | A | 4/1986 | Gupta et al. |
| 4,643,782 | A | 2/1987 | Harris et al. |

(Continued)

FOREIGN PATENT DOCUMENTS

EP    0740977 A1    11/1996

(Continued)

*Primary Examiner*—Jennifer McNeil
(74) *Attorney, Agent, or Firm*—Buchanan Ingersoll PC

(57) ABSTRACT

A gas turbine component consists of a superalloy base material with a single crystal structure and a protective MCrAlY-coating (6). The MCrAlY-coating (6) has a g/g' single crystal structure, which is epitaxial with the base material. It has be determined the critical factors for the successful epitaxial and crack-free growth of the MCrAlY-coating (6).

14 Claims, 2 Drawing Sheets
(2 of 2 Drawing Sheet(s) Filed in Color)

U.S. PATENT DOCUMENTS

| | | |
|---|---|---|
| 4,743,514 A | 5/1988 | Strangman et al. |
| 4,758,480 A | 7/1988 | Hecht et al. |
| 4,973,445 A | 11/1990 | Singheiser |
| 5,232,789 A | 8/1993 | Platz et al. |
| 5,316,866 A * | 5/1994 | Goldman et al. ........... 428/621 |
| 5,759,301 A | 6/1998 | Konter et al. |
| 5,888,451 A | 3/1999 | Konter et al. |
| 5,993,980 A | 11/1999 | Schmitz et al. |
| 6,024,792 A | 2/2000 | Kurz et al. |
| 6,277,500 B1 * | 8/2001 | Konter et al. ................ 428/615 |
| 6,403,165 B1 * | 6/2002 | Grylls et al. ................. 427/456 |
| 6,629,368 B1 * | 10/2003 | Schnell et al. ............. 29/889.1 |

FOREIGN PATENT DOCUMENTS

EP            1001055 A1      5/2000

* cited by examiner

MCRALY-COATING

FIELD OF INVENTION

The invention relates to a MCrAlY-coating.

STATE OF THE ART

Components designed for the use in the area of high temperature, e.g. blades or vanes of a gas turbine, are usually coated with resistant coatings. The coating protects the base material against corrosion and oxidation due to the thermal effect of the hot environment and consists of an alloy mostly using the elements Al and Cr. Most turbine components are coated for the protection from oxidation and/or corrosion with, for example, a MCrAlY coating (base coat) and some are also coated with a thermal barrier coating (TBC) for thermal insulation. MCrAlY protective overlay coatings are widely known in the prior art. They are a family of high temperature coatings, wherein M is selected from one or a combination of iron, nickel and cobalt. As an example U.S. Pat. No. 3,528,861 or U.S. Pat. No. 4,585,481 are disclosing such kind of oxidation resistant coatings. U.S. Pat. No. 4,152,223 as well discloses such method of coating and the coating itself. Besides the γ/β-MCrAlY-coating, there is another class of overlay MCrAlY coatings which are based on a γ/γ'-gamma/gamma prime-structure. The advantages of γ/γ'-coatings is that they have a negligible thermal expansion mismatch with alloy of the underlying turbine article. For higher thermal fatigue resistance the γ/γ'-coating are more convenient compared to the γ/β-type of MCrAlY-coatings. A higher thermal fatigue resistance in coatings is most desirable since failure of the most turbine blades and vanes at elevated temperature is typically thermal fatigue driven.

Among γ/γ'-coatings and γ/β-coatings, the field of γ/β-coatings have been an active area of research and a series of patents has been issued. E.g. a NiCrAlY coating is described in U.S. Pat. No. 3,754,903 and a CoCrAlY coating in U.S. Pat. No. 3,676,058. U.S. Pat. No. 4,346,137 discloses an improved high temperature fatigue resistance NiCoCrAlY coating. U.S. Pat. No. 4,419,416, U.S. Pat. No. 4,585,481, RE-32,121 and U.S. Pat. No. 4,743,514 describe MCrAlY coatings containing Si and Hf. U.S. Pat. No. 4,313,760 discloses a superalloy coating composition with good oxidation, corrosion and fatigue resistance.

In contrast to the γ/β-coatings, the γ/γ'-type of MCrAlY coatings, known e.g. from U.S. Pat. No. 4,973,445, are relatively new. The unique feature of this type of γ/γ'-coatings is that their thermal expansion mismatch is close to zero in combination with a high ductility, what make these coatings more resistant to thermal fatigue. However the limitations are the low aluminum content and hence their low reservoir of aluminum.

Furthermore, U.S. Pat. No. 4,758,480 discloses a class of coatings whose composition is based on the composition of the underlying substrate. The similarity in phase structure and in the chemical composition renders the mechanical properties of the coating similar to those of the substrate thereby reducing thermomechanically-reduced damage during service. However, when this coating is applied by traditional means on the single crystal substrate, the difference in the E-modulus between <010> oriented surface layer of the substrate and randomly oriented coating grains produce high TMF damage.

U.S. Pat. No. 5,232,789 discloses the further improvement of the TMF properties of the coating-substrate system. The coating, which has composition and phase structure similar to the substrate alloy, has at least 1000 times more fine-grained structure, produced by a special technology. The lowermost interface portion of the fine-grained coating grows epitaxially, and therefore has the same crystal orientation as the substrate. Epitaxial growth solves also coating/substrate interface adhesion problem.

However, the system of a single crystal substrate and the multicrystal coating still has a large difference in the mechanical behavior between the substrate and the coating as any equiaxed structure possesses E-modulus much higher than those for single crystal material in <001> direction. Higher E-modulus reflects in lower TMF life of the coating compared to the substrate (although the stresses on substrate-coating interface are significantly reduced compared to the traditional coating-substrate system). Multiple grain boundaries drastically reduce the creep resistance of the fine-grain coating, which finally determines life of the entire blading system.

Therefore, in general, U.S. Pat. No. 6,024,792 is disclosing a method for producing monocrystalline structures on substrates with monocrystalline structures by using an energy beam of high energy from an energy source. The material which is to be introduced into the monocrystalline structure is supplied to the melted region of the substrate. The supplied material is completely melted. An similar method is known from EP-A1-740 977.

More special, EP-A1-1 001 055 is disclosing a MCrAlY-coating and a method of depositing the coating, whereby the coating is epitaxially on the base material and the coating is grown with a single crystal structure. The coating is applied by laser cladding. It was found, in fact, that it was difficult to grown a defect free epitaxial coating with the mentioned γ/γ' forming coating material within this document. When using other commercially available highly oxidation resistant alloys for the laser cladding process, the single crystal microstructure can not be maintained. Hot tearing cracks and the breakdown of single crystal solidification occur in the cladded structure, which results in the formation of undesirable equiaxed grains.

SUMMARY OF THE INVENTION

It is object of the present invention to find a γ/γ'-MCrAlY-coating and to determine in detail the parameter of cladding a defect free, epitaxial coating on a single crystal article. The epitaxial coating is grown on the single crystal substrate, which means that it has the same crystallographic orientation as the substrate.

According to the invention, a bond MCrAlY-coating was found, wherein the MCrAlY has a γ/γ'-phase and wherein the MCrAlY comprises less than 1.2 wt.-% Si.

Another condition for advantageous embodiment the epitaxial solidification of the coating is that the solidification temperature interval $\Delta T_0$ of the MCrAlY-coating is smaller than 30° C.

To obtain a crack-free coating the last 5% of the MCrAlY-coating liquid must solidify in a temperature interval $\Delta T_1$ smaller than 15° C.

Both factors, a small solidification interval and the last 5% of the liquid, here determines the width of the mushy zone, the narrower the mushy zone the lower is the susceptibility for hot tearing during the cladding process.

To obtain a small solidification interval $\Delta T_0$ the composition of the MCrAlY-coating should be well balanced to avoid large segregation and low melting interdendritic constituent or as close as possible to the eutectic line on the γ-phase side of the eutectic line of the ternary phase diagram Ni—Al—Cr.

As an example the MCrAlY-coating has the following composition (wt.-%) 18–26.0% Cr, 5–8.0% Al, 0.1–1.2% Si, 0.4–1.2% Y, 0–0.1% Hf and 0.1–1.2% Ta, balance Ni and unavoidable impurities with with Σ(Al+Si)<10%, Σ(Si+Ta)< 2.5%, Σ(Y+Hf+Zr+La)<1.5%, C max. 0.03%.

Advantageous to obtain a small solidification interval, the coating will comprise an addition of Si up to 0.5 wt.-%, Hf up to 0.5 wt.-%, Y below 0.5 wt.-%, Ta below 3 wt.-%

For increased oxidation resistance the coating may contain Fe, Ga, Mg, Ca individually or a combination thereof.

In an advantageous embodiment, the MCrAlY-coating is applied by laser cladding with a thickness of 100 to 300 μm and the article is a gas turbine component made a from nickel base super alloy.

BRIEF DESCRIPTION OF DRAWINGS

The patent or application file contains at least one drawing executed in color. Copies of this patent or patent application publication with color drawing(s) will be provided by the Office upon request and payment of the necessary fee.

This invention is illustrated in the accompanying drawing, in which.

The drawings show only parts important for the invention.

DETAILED DESCRIPTION OF INVENTION

Figure 1:
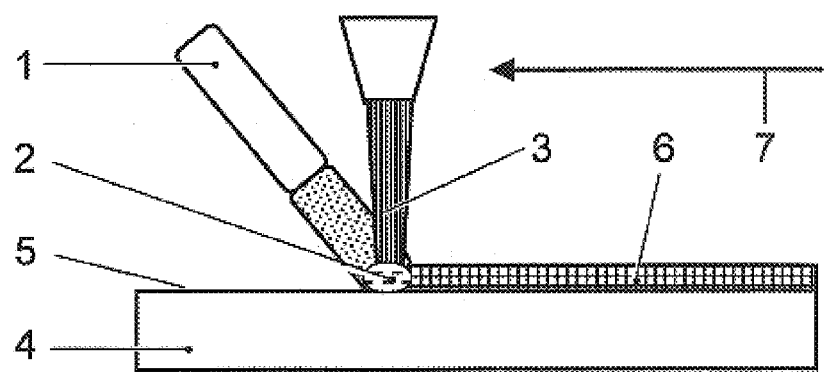
FIG. 1 shows a schematic representation of a laser cladding process.

This invention is related to a method of epitaxially growing a MCrAlY-coating 6 having a γ/γ'-microstructure onto a surface 5 of an article 4 such as blades or vanes of gas turbines or any other part which is exposed to a hot temperature environment. The article 4 has a single crystal (SX) structure and can be made, as an example, from a nickel base super-alloy. Nickel base superalloys are known in the state of the art, e.g. from the document U.S. Pat. No. 5,888,451, U.S. Pat. No. 5,759,301 or from U.S. Pat. No. 4,643,782, which is known as "CMSX-4". In general, FIG. 1 shows a laser cladding process which is characterized by impinging particles of the MCrAlY-coating material with a powder jet 1 onto a molten pool 2 formed by controlled laser heating by scanning the laser beam 3 successively over the surface 5 of the single crystal article 4. The arrow 7 shows the direction of the movement over the article 4.

The laser cladding technology has been used to apply an epitaxial γ/γ'-MCrAlY-coating 6 with 100–300 μm thickness on the single crystal superalloy article 4. The coating 6 is epitaxially grown on the article 4, which means that it has the same crystal orientation as the article 4.

It has be found that the following factors are critical for the successful epitaxial growth of the MCrAlY-coating 6. The solidification interval $\Delta T_0$ of the coating 6 must be narrow for two reasons. Firstly high solidification interval leads generally to high growth undercooling. The higher the growth undercooling, the higher the risk of heterogeneous nucleation of equiaxed grains. Those equiaxed grains need to be avoided, as their crystallographic orientation is not controlled. Secondly, an high solidification interval increases the length of the mushy zone and, therefore, increases the hot cracking susceptibility. To obtain a small solidification interval $\Delta T_0$ of the MCrAlY-coating the MCrAlY comprises less than 1.2% Si. As an example the solidification interval $\Delta T_0$ shall be 30° C. and smaller. The solidification interval must be low to enable the growth of SX microstructure and to prevent hot tearing. The smaller $\Delta T_0$ is the bigger the process window, for a crack-free and single crystal growth.

The MCrAlY coating 6 has a designed solidification interval $\Delta T_0$ by alloying with a controlled amount of certain elements. The solidification interval $\Delta T_0$ increases or decreases with the addition of the elements such as Si, Hf, Zr, Y, Ta. Furthermore, the SX-MCrAlY coating 6 design results in a chemical composition close to the eutectic line on the γ-phase side of the eutectic line of the phase diagram of nickel-chromium-aluminum ternary. The closer one gets to the eutectic line the narrower the solidification interval $\Delta T_0$. Here, $\Delta T_0$ is mainly controlled by the Al content of the coating 6. The coating 6 may contain the elements Si, Hf and Zr and a small addition of Ta, Fe, Ga, Mg, Ca individually or a combination thereof as well for increased oxidation resistance.

A γ/γ'-MCrAlY-coating 6 according to the invention can have the preferred range of following composition (wt. %): 18–26.0% Cr, 5–8.0% Al, 0.1–1.2% Si, 0.4–1.2% Y, 0–0.1% Hf, 0.1–1.2% Ta, balance Ni and unavoidable impurities with Σ(Al+Si)<10%, Σ(Si+Ta)<2.5%, Σ(Y+Hf+Zr+La)< 1.5%, C max. 0.03%.

In addition, in an advantageous embodiment to obtain a favorable, low solidification interval $\Delta T_0$, the concentration of minor elements in the coating should be Si up to 0.5 wt.-%, Hf up to 0.5 wt.-%, Y below 0.5 wt.-% and Ta below 3 wt.-%

The concentration of the minor elements such as Y, Zr and Ta must also be adjusted to prevent formation of brittle Ni (Ta, Si) phases containing these elements.

Another important factor is that the last 5% liquid should solidify in a $\Delta T_1$ interval smaller than 15° C. in order to prevent hot tearing. The $\Delta T_1$ here determines the width of the mushy zone, the narrower the mushy zone the lower is the susceptibility for hot tearing during the cladding process.

The composition of the MCrAlY should be adjusted to avoid precipication of Cr-rich sigma or any other undesirable phases. The brittle sigma phases are detrimental to the mechanical properties of the coating.

Examples of γ/γ'-MCrAlY coating according to the invention are shown in table 1. (wt.-%)

TABLE 1

| Example | Ni | Cr | Al | Ta | Si | Y | $\Delta T_0$ [° C.] |
|---|---|---|---|---|---|---|---|
| I | Bal. | 25 | 6 | — | — | 0.4 | 25 |
| II | Bal. | 16.5 | 5.5 | — | — | 0.4 | 25 |
| SV20 | Bal. | 24 | 5 | 1 | 2.5 | 0.5 | 95 |

It is to be noted that the $\Delta T_0$ of coatings I and II in table 1 is approximately 25° C., while the $\Delta T_0$ of SV20 is 95° C. The coatings I and II can be deposited on a substrate as a crack-free single crystal but not SV20. Since $\Delta T_0$ of SV20 is much higher than 30° C., interdendritic cracking (hot cracking) initiate during solidification and propagate into the substrate and the deposit during cooling, driven by thermal stresses.

On the other hand, when the laser parameters e.g. such as laser power, scanning speed, protection gas are optimized and balanced against each other for the deposition of a SX-MCrAlY coating 6 onto a SX base material. The alloy design of the newly MCrAlY coating 6 supports the maintenance and growth of the SX coating.

Figure 2:
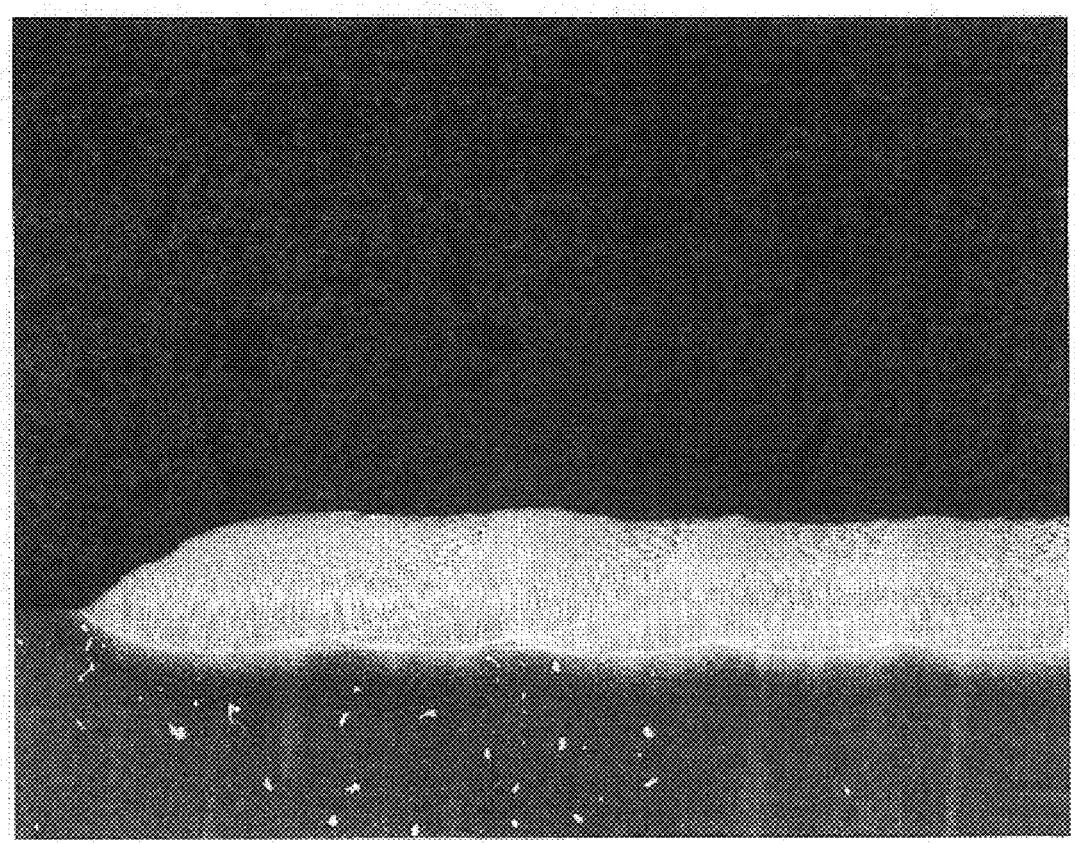
FIG. 2 shows an example of an epitaxially and crack-free γ/γ'-MCrAl-coating according to the invention and FIG. 3 shows an example of a cracked γ/γ'-MCrAl-coating.

The Example of FIG. 2 shows a result of a coating from this invention with a fully SX-structure and no cracks. The condition of the annexed claim have been fulfilled. The very even and parallel dendrite structure indicate the SX structure of the clad, which has been also proven with the Electron Back Scattering Diffraction (EBSD) Kikuchi technique.

Figure 3:
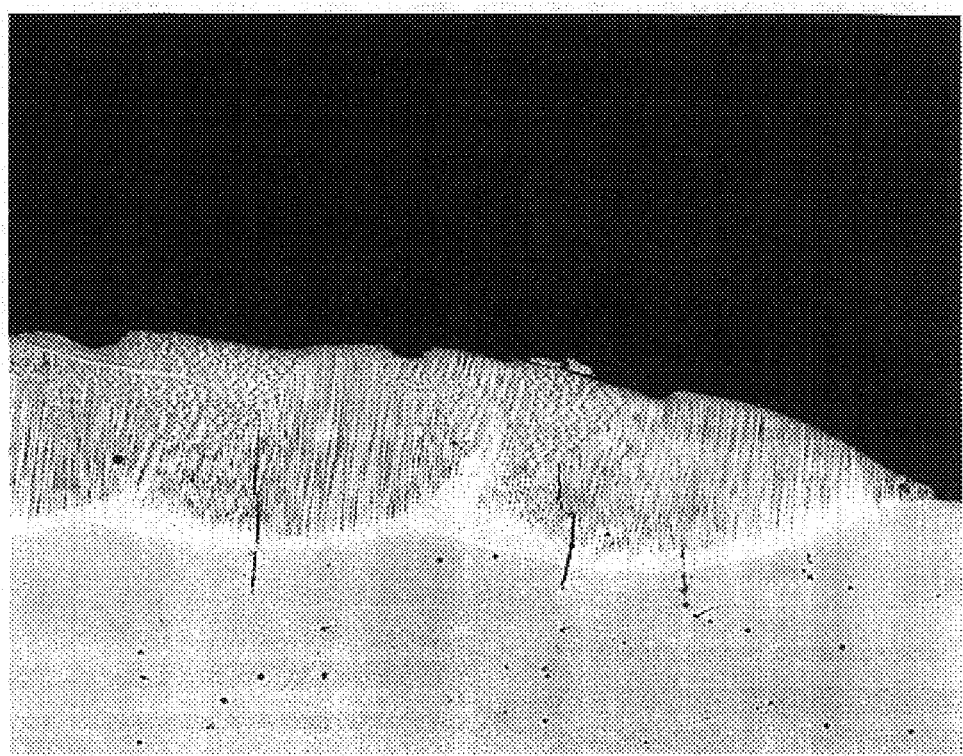

In contradiction FIG. 3 shows an example of a cracked sample at the CMSX-4 interface. Although cladded with optimized Laser parameters the coating material was very difficult to apply. Outside of the range of the conditions of the claims it is very susceptible to hot tearing and breakdown of SX structure.

REFERENCE NUMBERS

1 powder jet
2 molten pool
3 laser beam
4 article
5 surface of article 4
6 coating
7 direction of movement
$\Delta T_0$ Solidification interval of coating 6
$\Delta T_1$ Solidification interval of last 5% liquid of coating 6

The invention claimed is:

1. An article having a surface and a single crystal structure, the article coated with protective MCrAlY-coating epitaxially grown on the surface of the article, wherein the MCrAlY-coating has a solidification temperature interval ($\Delta T_0$) of smaller than 30° C. and a temperature interval ($\Delta T_1$) of the last 5% liquid of smaller than 15° C., and wherein the MCrAlY has a γ/γ'-structure and the MCrAlY comprises less than 1.2 wt. % Si.

2. The article according to claim 1, wherein the composition of the MCrAlY-coating is close to the eutectic line on the γ-phase side of the eutectic line of the ternary phase diagram of Ni—Al—Cr.

3. The article according to claim 1, wherein the MCrAlY-coating comprises the following composition (wt. %): 18–26.0% Cr, 5–8.0% Al, 0.1–1.2% Si, 0.4–1.2% Y, 0–0.1% Hf, 0.1–1.2% Ta, balance Ni and unavoidable impurities, with Σ(Al+Si)<10%, Σ(Si+Ta)<2.5%, Σ(Y+Hf+Zr+La)<1.5%, C max. 0.03%.

4. The article according to claim 1, wherein the MCrAlY-coating comprises (wt. %): Si up to 0.5%, Hf up to 0.5%, Y<0.5% and Ta<3%, individually or a combination thereof.

5. The article according to claim 1, wherein the MCrAlY-coating comprises an addition of Fe, Ga, Mg, Ca, individually or a combination thereof.

6. The article according to claim 1, wherein the MCrAlY-coating has a thickness of 100–300 μm.

7. The article according to claim 1, wherein the MCrAlY-coating is applied by laser cladding.

8. The article according to claim 1, which is a gas turbine component made from nickel base super alloy.

9. An article having a surface and a single crystal structure, the article coated with protective MCrAlY-coating epitaxially grown on the surface of the article, wherein the MCrAlY has a γ/γ'-structure and has the following chemical composition (wt. %): 25 Cr, 6 Al, 0.4 Y, less than 1.2 wt. % Si, balance Ni and unavoidable impurities.

10. The article according to claim 9, wherein the MCrAlY-coating has a solidification temperature interval ($\Delta T_0$) of 25° C.

11. The article according to claim 9, which is a gas turbine component made from nickel base super alloy.

12. An article having a surface and a single crystal structure, the article coated with protective MCrAlY-coating epitaxially grown on the surface of the article, wherein the MCrAlY has a γ/γ'-structure and has the following chemical composition (wt. %): 16.5 Cr, 5.5 Al, 0.4 Y, less than 1.2 wt. % Si, balance Ni and unavoidable impurities.

13. The article according to claim 12, wherein the MCrAlY-coating has a solidification temperature interval ($\Delta T_0$) of 25° C.

14. The article according to claim 12, which is a gas turbine component made from nickel base super alloy.

* * * * *